US010659597B2

(12) United States Patent
Catalano et al.

(10) Patent No.: US 10,659,597 B2
(45) Date of Patent: May 19, 2020

(54) LIMITING COMPUTING DEVICE FUNCTIONALITY USING CAPACITIVE COUPLING THROUGH A HUMAN BODY

(71) Applicant: International Business Machines Corporation, Armonk, NY (US)

(72) Inventors: Pasquale A. Catalano, Wallkill, NY (US); Samuel R. Connor, Apex, NC (US); Andrew G. Crimmins, Montrose, NY (US); John Thomas Kinnear, Jr., LaGrangeville, NY (US); Arkadiy O. Tsfasman, Wappingers Falls, NY (US); John S. Werner, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/144,586

(22) Filed: Sep. 27, 2018

(65) Prior Publication Data

US 2020/0106878 A1    Apr. 2, 2020

(51) Int. Cl.
*H04M 1/725* (2006.01)
*G06F 3/044* (2006.01)
(Continued)

(52) U.S. Cl.
CPC ........ *H04M 1/72577* (2013.01); *G01R 23/15* (2013.01); *G06F 3/011* (2013.01); *G06F 3/044* (2013.01); *G06F 3/0416* (2013.01); *H03K 5/24* (2013.01); *H04M 1/72569* (2013.01);

*H04W 48/04* (2013.01); *H04M 2207/18* (2013.01); *H04M 2242/14* (2013.01); *H04M 2250/12* (2013.01)

(58) Field of Classification Search
CPC ........ H04M 1/72577; H04M 1/72569; H04M 2207/18; H04M 2250/12; H04M 2242/14; G06F 3/044; G06F 3/011; G06F 3/0416; H03K 5/24; G01R 23/15; H04W 48/04
See application file for complete search history.

(56) References Cited

U.S. PATENT DOCUMENTS 8,145,199 B2    3/2012   Tadayon et al.
8,401,578 B2    3/2013   Inselberg
(Continued)

*Primary Examiner* — Ibrahim A Khan
(74) *Attorney, Agent, or Firm* — Cantor Colburn LLP; Teddi Maranzano

(57) ABSTRACT

Embodiments of the invention are directed to a computer-implemented-method of operating a computing device. The computer-implemented method includes using a local touch-activated sensor of the computing device to receive an input signal, wherein the input signal has been generated at a remote touch-activated sensor based on capacitive coupling between the remote touch-activated sensor and a human, passed to the human using the capacitive coupling between the remote touch-activated sensor and the human, passed through the human, and transmitted from the human to the local touch-activated sensor of the computing device using a capacitive coupling between the human and the local touch-activated sensor. Functionality of the computing device is limited based at least in part on analyzing, using the computing device, at least one characteristic of the input signal.

17 Claims, 8 Drawing Sheets

(51) Int. Cl.
   *G06F 3/041*   (2006.01)
   *H04W 48/04*   (2009.01)
   *H03K 5/24*   (2006.01)
   *G01R 23/15*   (2006.01)
   *G06F 3/01*   (2006.01)

(56) References Cited

U.S. PATENT DOCUMENTS

| | | |
|---|---|---|
| 9,161,208 B2 | 10/2015 | Inselberg |
| 10,255,422 B1* | 4/2019 | Last .................. G06F 21/35 |
| 2006/0136015 A1* | 6/2006 | Park ................... A61B 5/0031 |
| | | 607/60 |
| 2008/0233919 A1 | 9/2008 | Kenney |
| 2008/0299900 A1 | 12/2008 | Lesyna |
| 2009/0040193 A1 | 2/2009 | Geaghan |
| 2009/0233548 A1 | 9/2009 | Andersson et al. |
| 2011/0065375 A1* | 3/2011 | Bradley ............ H04M 1/72577 |
| | | 455/1 |
| 2011/0195699 A1* | 8/2011 | Tadayon ............ H04B 5/0062 |
| | | 455/418 |
| 2011/0294465 A1* | 12/2011 | Inselberg .......... H04M 1/72577 |
| | | 455/410 |
| 2012/0139865 A1* | 6/2012 | Krah .................... G06F 3/044 |
| | | 345/174 |
| 2013/0072174 A1 | 3/2013 | Enty et al. |
| 2014/0066124 A1 | 3/2014 | Novet |
| 2015/0147963 A1* | 5/2015 | Harada ............ H04W 52/0245 |
| | | 455/41.1 |
| 2017/0230121 A1* | 8/2017 | Tanaka ................ G01S 1/68 |
| 2017/0332908 A1* | 11/2017 | Uno ................... G06K 19/07 |
| 2018/0074650 A1* | 3/2018 | Shchur ................ G06F 3/011 |
| 2019/0132059 A1* | 5/2019 | Tanaka .................. H04B 1/59 |

* cited by examiner ics, and the like. Although rules and social norms often discourage the use of computing devices in certain environments, such rules and social norms are often ignored. Using a computing device in the environments described above can prove distracting to the user or others around them or, in some cases, signals could cause potential interference with ground networks causing malfunction of nearby electronics.

LIMITING COMPUTING DEVICE FUNCTIONALITY USING CAPACITIVE COUPLING THROUGH A HUMAN BODY

BACKGROUND

The present invention relates generally to programmable computer systems, and more specifically to computer-implemented methods, computer systems and computer program products configured and arranged to limit computing device functionality using activating signals that are capacitively coupled from a touch-point through a human body to the computing device.

Mobile computing devices are hand-held devices that have the hardware and software required to execute typical desktop and web-based applications. Mobile computing devices have similar hardware and software components as those used in personal computers (PCs), such as processors, random memory and storage, Wi-Fi, and a base operating system (OS). However, they differ from PCs in that they are built specifically for mobile architectures and to enable portability. Among the common examples of mobile computing devices include tablet PCs, personal digital assistants (PDAs), laptops, smartwatches, or smartphones, each of which includes a built-in processor, memory and OS that are capable of executing a wide variety of computer software application programs. Because of their mobility, mobile computing devices make computing power and connectivity available to users in virtually any environment. Accordingly, mobile computing devices are now present in any environment where users are present.

SUMMARY

Embodiments of the invention are directed to a computer-implemented-method of operating a computing device. The computer-implemented method includes using a local touch-activated sensor of the computing device to receive an input signal, wherein the input signal has been generated at a remote touch-activated sensor based on capacitive coupling between the remote touch-activated sensor and a human, passed to the human using the capacitive coupling between the remote touch-activated sensor and the human, passed through the human, and transmitted from the human to the local touch-activated sensor of the computing device using a capacitive coupling between the human and the local touch-activated sensor. Functionality of the computing device is limited based at least in part on analyzing, using the computing device, at least one characteristic of the input signal.

Embodiments are further directed to computer systems and computer program products having substantially the same features as the above-described computer-implemented method.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

Figure 1:
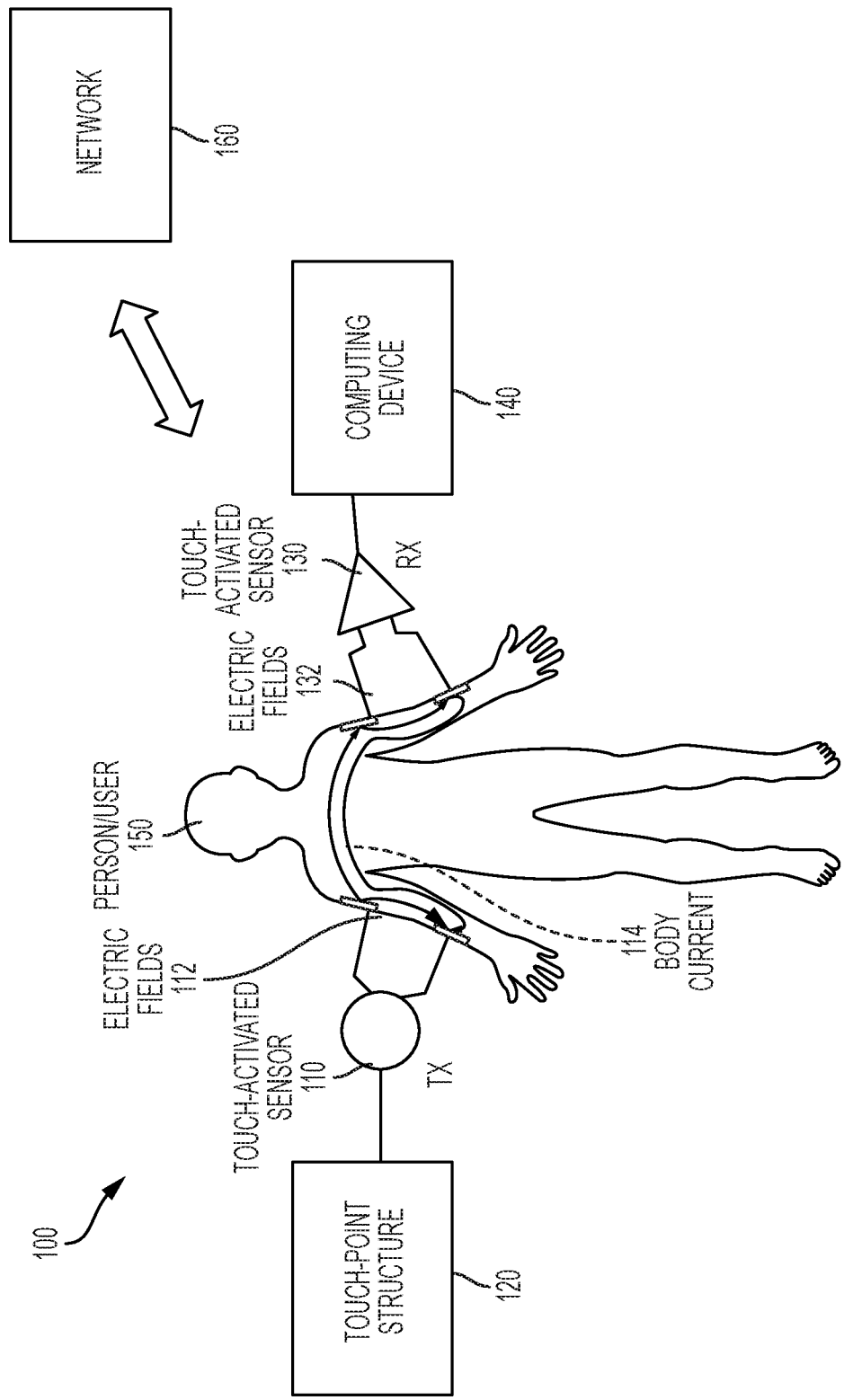
FIG. 1 is a block diagram of a system embodying aspects of the invention.

In the accompanying figures and following detailed description of the disclosed embodiments, the various elements illustrated in the figures are provided with three-digit reference numbers. The leftmost digit of each reference number corresponds to the figure in which its element is first illustrated.

DETAILED DESCRIPTION

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to a more detailed description of technologies that are more specifically related to aspects of the invention, improvements in the computational speed, size, and portability of computing systems/devices have enabled the continued integration of computer functionality into everyday life. For example, small mobile computing systems, such as miniaturized computers, input devices, sensors, detectors, image displays, wireless communication devices as well as image and audio processors, can be integrated into computing devices that fit easily in a user's pocket or travel bag. Hence, computing devices are now present in any environment where users are present. However, in some environments, the use of computing devices can be problematic. Such environments include airplanes during takeoff/landing, schools/classrooms, the driver's seat of a moving vehicle, theaters, hospitals, restaurants, librar- Turning now to an overview of aspects of the present invention, embodiments of the invention are directed to computer-implemented methods, computer systems and computer program products configured and arranged to automatically limit the functionality of a computing device in selected environments. In embodiments of the invention, the computing device is a mobile computing device, examples of which include smartphones, smartwatches, PDAs, tablets, laptops, e-readers, portable entertainment devices, and the like. In embodiments of the invention, a remote touch-activated sensor and a local computing system are used to generate a current at a known frequency based on the remote touch-activated sensor determining that it has been touched by, or is within a predetermined distance from, a person. In embodiments of the invention, the remote touch-activated sensor is located in an area (e.g., chair, table, booth, steering wheel, desk, etc.) where the user is likely to make contact with the remote touch-activated sensor. In embodiments of the invention, the remote touch-activated sensor is configured and arranged to induce in the user a corresponding current at the known frequency when the user touches or is within a predetermined distance from the remote touch-activated sensor. The current induced in the user is referred to herein as the body current. In embodiments of the invention, because the remote touch-activated sensor relies on capacitive coupling between the remote touch-activated sensor and the user to induce the body current at the known frequency, it is not necessary that the user make physical contact with the remote touch-activated sensor. Hence, the remote touch-activated sensor can be activated when a user makes contact with the remote touch-activated sensor through an intermediary element such as gloves or clothing. In this specification, descriptions of a user making contact with a touch-activated sensor includes situations in which the user makes contacts with the touch-activated sensor through an intermediary element.

In accordance with aspects of the invention, when the user contacts the remote touch-activated sensor and contacts a touch-activated sensor (e.g., a touch screen) of a computing device (e.g., a mobile smartphone), a closed circuit is created and the body current induced in the user travels through user's body at the known frequency to the touch-activated sensor of the computing device. In embodiments of the invention, the remote touch-activated sensor and the local computing system are configured and arranged to dynamically manage characteristics of the body current induced in the user. The National Electrical Code® (NEC) provides comprehensive regulations for electrical wiring, over-current protection, grounding, and installation of equipment. The NEC has, to date, identified 5 mA to be the safe upper limit for children and adults experiencing current flow, with 1 mA being identified as the threshold for a person beginning to feel a tingling sensation as a result of the current flow. In embodiments of the invention, the remote touch-activated sensor and the local computing system are configured and arranged to dynamically manage characteristics of the induced body current such that it is maintained below the NEC's 1 mA threshold. In some aspects of the invention, the remote touch-activated sensor and the local computing system can be configured to utilize cognitive computing algorithms to extract features from training data in order to construct a model of the path through which the body current will travel by classifying the training data and identify relationships between and among the classified training data. This model, which is referred to herein as the body current path (BCP) model, can be used to dynamically manage characteristics of the induced body current such that it has sufficient power to travel through the user and be detected by the touch-activated sensor of the computing device while being maintained below the NEC's 1 mA threshold.

Presumably, the user is contacting the touch-activated sensor of the computing device in order to initiate a function of the computing device (e.g., place a phone call). In accordance with aspects of the invention, when the user contacts the touch-activated sensor of the computing device, a capacitive coupling path is created between the user and the touch-activated sensor of the computing device, and the current that was induced in the user at the known frequency by the remote touch-activated sensor is capacitively coupled from the user to the touch-activated sensor of the computing device at the same known frequency. In accordance with aspects of the invention, the computing device is configured and arranged to analyze current received at the touch-activated sensor of the computing device in order to determine whether the current received at the touch-activated sensor is at the known frequency. In accordance with aspects of the invention, the computing device is configured and arranged to place the computing device in a limited access mode based at least in part on determining that a current received at the touch-activated sensor is at or within a predetermined range of the known frequency. The limited access mode can be configured to limit functionality of the computing device in a variety of ways while always allowing emergency calling and other emergency features. In embodiments of the invention, limited access mode can be tailored to the situation with the use of different frequencies for the known frequency generated at the remote touch-activated sensor. For example, the computing device detecting the capacitively coupled current at a first known frequency can place the computing device in airplane mode, or the computing device detecting a second known frequency can place the computing device in a limited access mode that allows texts but no calls.

In accordance with aspects of the invention, the computing device can be configured and arranged to analyze current received at the touch-activated sensor of the computing device using a hardware circuit provided at the computing device. In accordance with aspects of the invention, the computing device can be configured and arranged to analyze current received at the touch-activated sensor of the computing device using a set of computer program instructions. In embodiments of the invention, the set of computer program instructions can be downloaded to the computing device over a network to which the computing device is communicatively coupled. In embodiments of the invention, the network can be configured and arranged to require downloading the computer program instructions as a condition for allowing the computing device to access the network. In embodiments of the invention, network blocking systems can be configured and arranged such that the only connectivity point for a computing device in a particular environment (e.g., a restaurant, a movie theater, and the like) is through a selected network, and the selected network requires downloading the computer program instructions as a condition for allowing the computing device to access to the selected network.

Turning now to a more detailed description of aspects of the invention, FIG. 1 depicts an example of a system 100 embodying aspects of the present invention. The system 100 includes touch-activated sensors 110, 130 and a computing device 140 configured and arranged as shown. In embodiments of the invention, the touch-activated sensor 110 is communicatively coupled to a touch-point structure 120, and the touch-activated sensor 130 is communicatively coupled to the computing device 140. In aspects of the invention, the touch-activated sensor 130 is implemented as a touch screen or multi-touch element that is an integral component of the computing device 140. In embodiments of the invention, the computing device 140 can be any suitable mobile computing device including, but not limited to, a smartphone, a tablet, a laptop, an e-reader, a portable media player, and the like. In embodiments of the invention, the touch-point structure 120 is any structure (e.g., chair, table, booth, steering wheel, desk, etc.) at a location (e.g., a vehicle driver seat, an airplane during takeoff/landing, classroom, theater, hospital, restaurant, library, etc.) where it is desired to automatically limit certain functionality of the computing device 140 when, under certain conditions, a person/user 150 attempts to initiate a function of the computing device 140. In embodiments of the invention, the conditions under which functionality of the computing device 140 can be limited include when the person/user 150 attempts to operate (or contact) the touch-activated sensor 130 of the computing device 140 when the person/user 150 is in contact with the touch-activated sensor 110 that is communicatively coupled to the touch-point structure 120.

Figure 4:
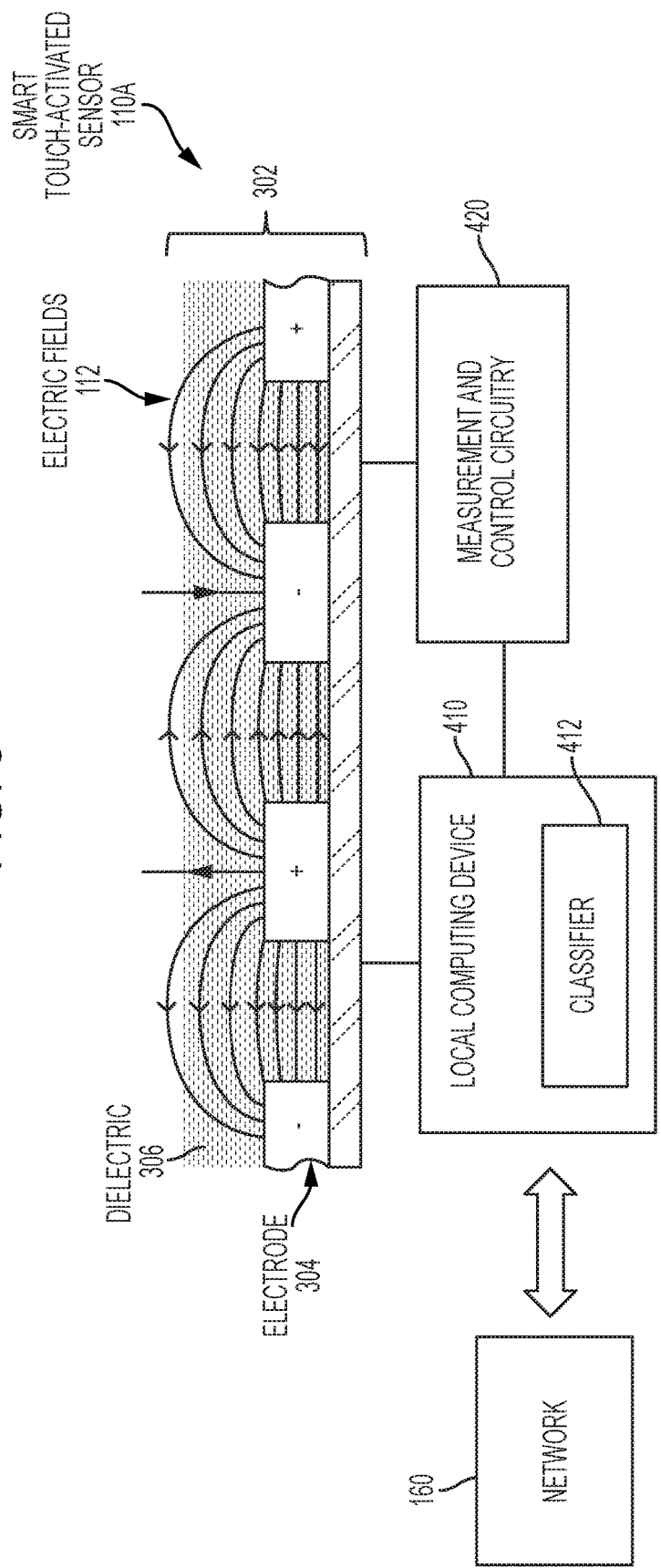
FIG. 4 is a block diagram illustrating additional details of a touch-activated sensor and computing device embodying aspects of the invention.
Figure 5:
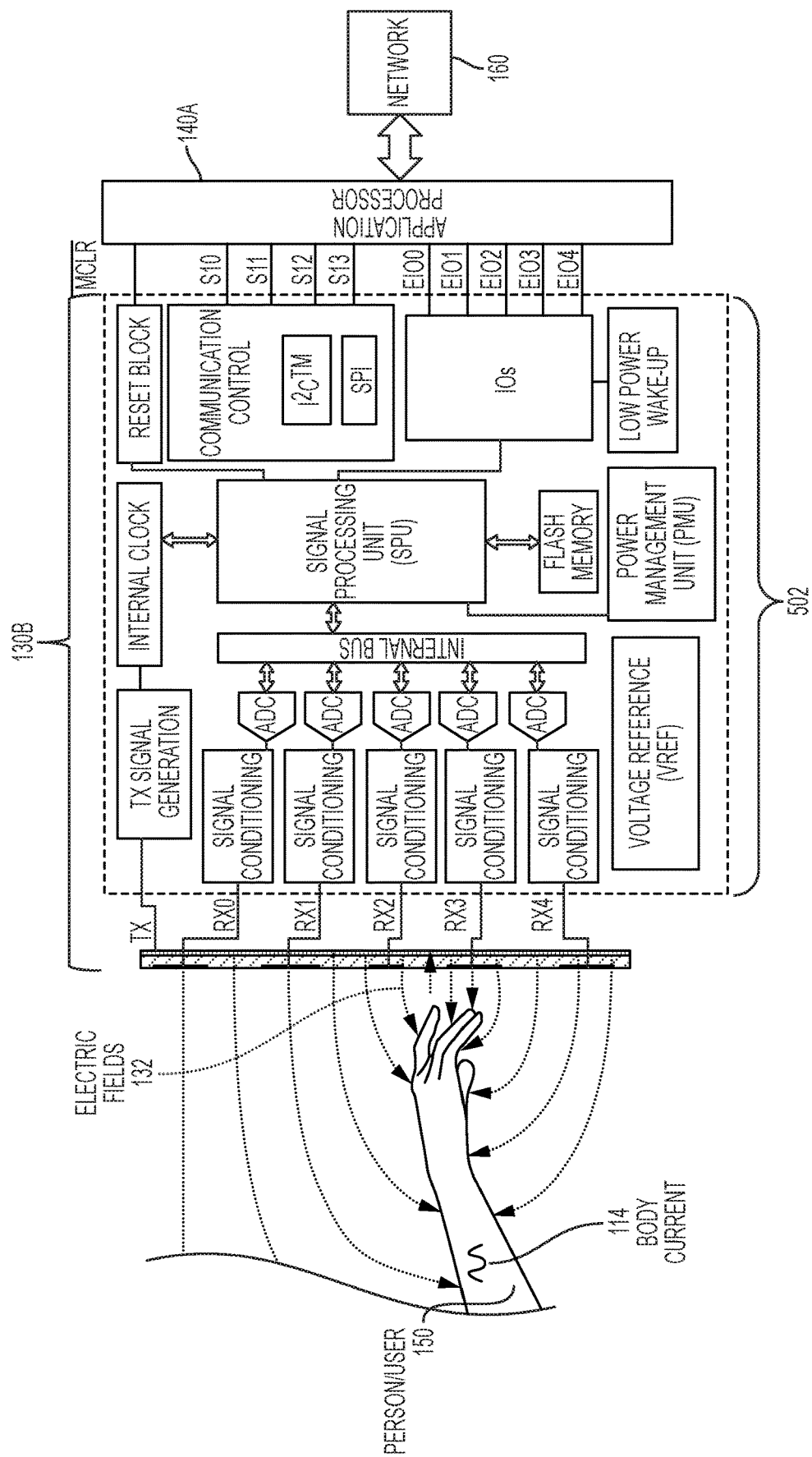
FIG. 5 is a block diagram illustrating additional details of a touch-activated sensor and computing device embodying aspects of the invention.
Figure 7:
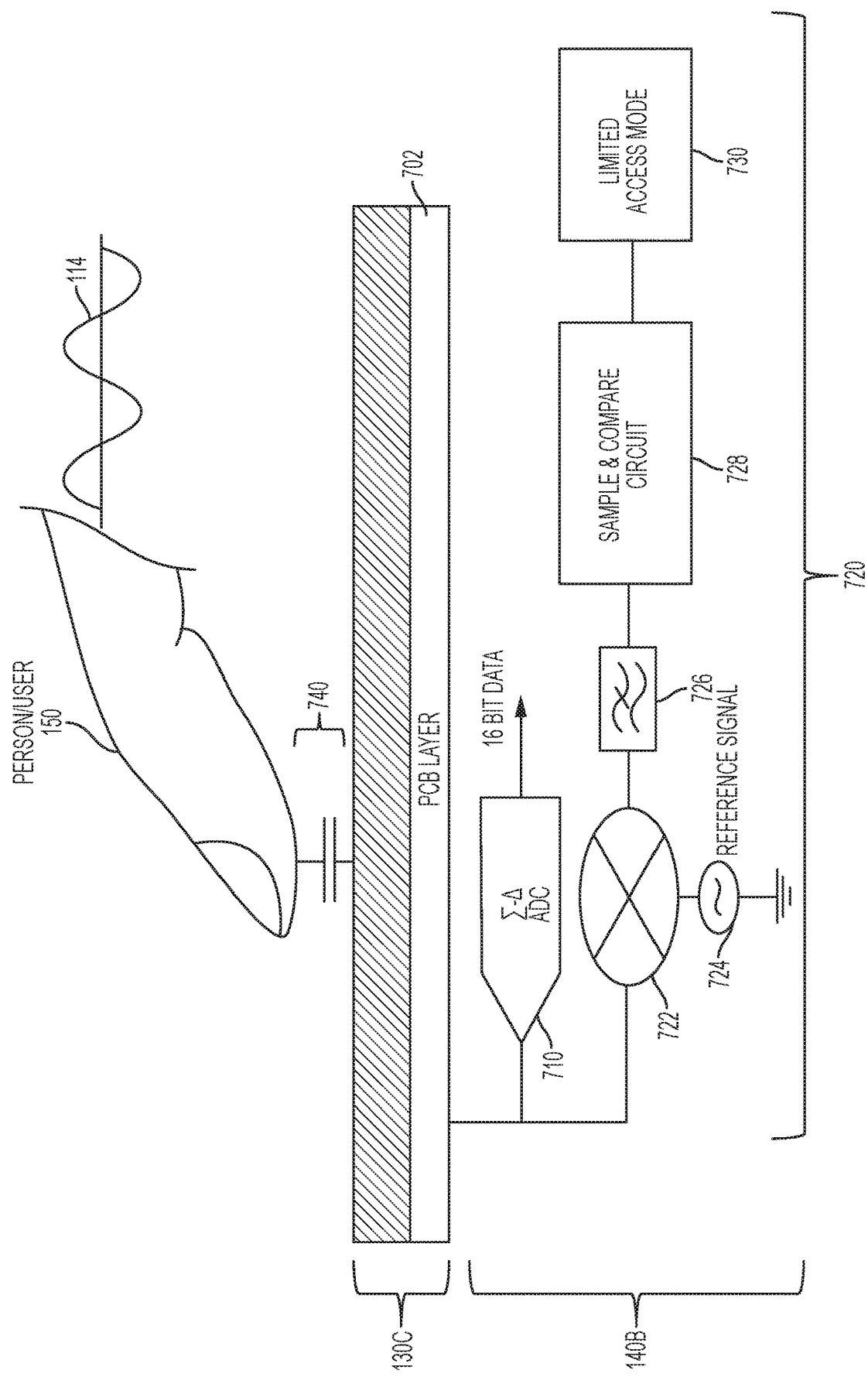
FIG. 7 is a block diagram illustrating additional details of a touch-activated sensor and computing device embodying aspects of the invention.

In embodiments of the invention, the touch-activated sensor 110 includes circuitry (e.g., measurement & control circuitry 420 shown in FIG. 4) configured to generate a current (I) at a known frequency (f1), thereby generating electric fields 112 at the touch-activated sensor 110. When the user 150 touches or is sufficiently close to the touch-activated sensor 110 to thereby reduce or otherwise alter the electric fields 112, a capacitive coupling conduction path is established between the touch-activated sensor 110 and the person/user 150. In general, when a capacitive coupling path is established between two circuit elements, alternating electrical signals or energy at one circuit element can induce, through the capacitive coupling path/medium, a corresponding alternating electrical signal or energy at the same frequency at the other circuit element. Thus, when the person/user 150 touches or is sufficiently close to the touch-activated sensor 110 to reduce or otherwise alter the electric fields 112, the current (I) at the known frequency (f1) induces a corresponding body current 114 at the frequency (f1) in the user 150 through a capacitive coupling path between the touch-activated sensor 110 and the user 150. In accordance with aspects of the invention, the touch-activated sensor 110 further includes circuitry (e.g., local computing device 410, classifier 412, and measurement & control circuitry 420 shown in FIG. 4) configured to control the current (I) and the corresponding induced body current 114 such that the body current 114 is sufficiently strong to travel through the person/user 150 and be detected by the touch-activated sensor 130 while being maintained below the NEC's 1 mA threshold. Additional details of how the touch-activated sensor 110 can be implemented as a smart touch-activated sensor 110A are shown in FIG. 4, and are described in greater detail subsequently herein. Additional details of how the touch-activated sensor 130 can be implemented as smart touch-activated sensors 130B, 130C are shown in FIGS. 5 and 7, and are described in greater detail subsequently herein.

Referring still to FIG. 1, when the user 150, while still in contact with the touch-activated sensor 110, operates the computing device 140 by contacting the touch-activated sensor 130, the user 150 reduces or otherwise alters the electric fields 132 such that a capacitive coupling conductive path is established between the user 150 and the touch-activated sensor 130. The body current 114, which is at the known frequency (f1) of the current (I) generated at the touch-activated sensor 110, moves from the user 150 to the computing device 140 through the conductive path. The computing device 140 is configured and arranged to analyze current signals received at the touch-activated sensor 130 in order to determine whether the current received at the touch-activated sensor 130 is the body current 114 at or within a predetermined range of the known frequency (f1). The computing device 140 is further configured to place the computing device 140 in a limited access mode based at least in part on determining that a current received at the touch-activated sensor 130 is the body current 114 at or within a predetermined range of the known frequency (f1). The limited access mode can be configured to limit functionality of the computing device 140 in a variety of ways while always allowing emergency calling and other emergency features. In embodiments of the invention, the limited access mode can be tailored to the situation by using different frequencies for the known frequency (f1) generated at the touch-activated sensor 110. For example, the computing device 140 detecting the capacitively coupled body current 114 at a first known frequency (f2) can place the computing device 140 in airplane mode, or a second known frequency (f3) can place the computing device 140 in a limited access mode that allows texts but no calls.

In embodiments of the invention, the computing device 140 can be configured and arranged to analyze current received at the touch-activated sensor 130 of the computing device 140 using a hardware circuit (e.g., analysis circuit 720 shown in FIG. 7) provided at the computing device 140. In embodiments of the invention, the computing device 140 can be configured and arranged to analyze current received at the touch-activated sensor 130 of the computing device 140 using a set of computer program instructions (e.g., methodology 600 shown in FIG. 6) running on a processor circuit (e.g., processor circuit 502 or application processor 140A shown in FIG. 5). In embodiments of the invention, the set of computer program instructions can be downloaded to the computing device 140 over a network 160 to which the computing device 140 is communicatively coupled. In embodiments of the invention, the network 160 can be configured and arranged to require downloading of the computer program instructions as a condition for allowing the computing device 140 to access the network 160. In embodiments of the invention, the network 160 can include signal blocking circuitry/systems configured such that the only network access for a computing device in a particular environment (e.g., a restaurant, a movie theater, and the like) is through the network 160, and the network 160 requires downloading the computer program instructions as a condition for allowing the computing device 140 to access the network 160.

Figure 2:
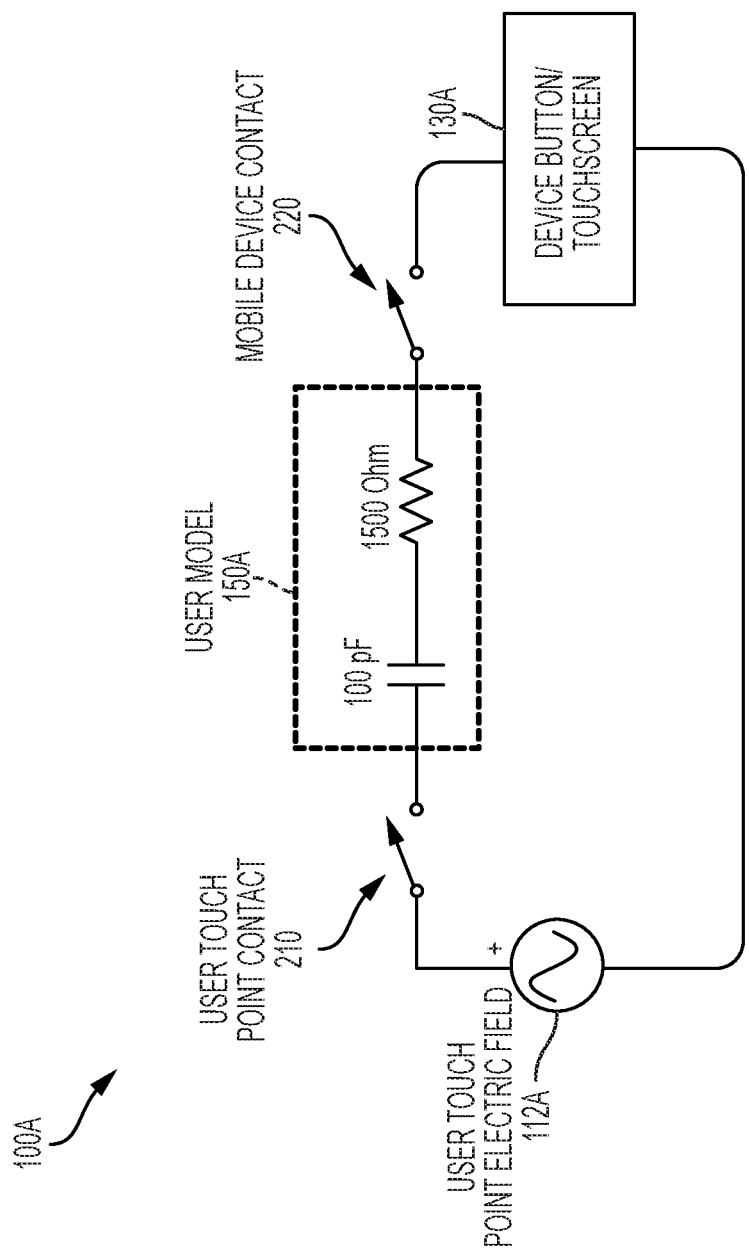
FIG. 2 is a block diagram illustrating another example of a system embodying aspects of the invention.

FIG. 2 depicts a schematic diagram of a system 100A in accordance with aspects of the invention. The system 100A is similar to the system 100 (shown in FIG. 1) except the user 150 (shown in FIG. 1) is represented by a user model 150A, which includes a 100 pF capacitive element and a 1.5KΩ resistive element configured and arranged as shown. The human body model for capacitance as defined by the Electrostatic Discharge Association (ESDA) is a 100 pF capacitor in series with a 1.5KΩ resistor. The system 100A includes a user touch point electric field 112A, a user touch point contact switch 210, the user model 150A, a mobile device contact switch 220, and a device button/touchscreen 130A, configured and arranged as shown. In the system 100A, if a user 150A (or user 150 shown in FIG. 1) is sufficiently close to the user touch point electric field 112A to reduce or otherwise alter the user touch point electric field 112A, capacitance will be generated between the user 150 and the source (i.e., the touch-activated sensor 110 shown in FIG. 1) that generates the user touch point electric field 112A. This capacitance functions as a coupling capacitance that can be detected at the user touch point electric field 112A to determine if there is a user 150A, 150 in contact with the source of the user touch point electric field 112A. The user 150A, 150 reducing or otherwise altering the user touch point electric field 112A is represented by the user touch point contact switch 210 closing.

Capacitance at the user touch point electric field 112A will vary based on many conditions such as temperature, humidity, body size, clothing, and the capacitance of the human body model 150A, which is defined as the 100 pF capacitor in series with the 1.5KΩ resistor. In accordance with aspects of the invention, the above-described and other conditions are analyzed (e.g., using the local computing device 410 and classifier 412 shown in FIG. 4) and used to dynamically control the current (I) that generates the user touch point electric field 112A. Controlling the current (I) also controls the current (e.g., the body current 114 shown in FIG. 1) induced in the body model 150A. In embodiments of the invention, the current (I) is controlled such that the current induced in the body model 150A is large enough to reach the device button/touchscreen 130A while staying below the NEC's 1 mA threshold.

In accordance with aspects of the invention, capacitance at the user touch point electric field 112A can be measured using circuitry (e.g., measurement & control circuitry 420 shown in FIG. 4) located at the source (e.g., touch-activated sensor 110 shown in FIG. 1) of the user touch point electric field 112A. Based on this capacitive measurement, the output AC voltage (V1) that generates the user touch point electric field 112A can be cognitively and dynamically varied/managed (e.g., using the local computing device 410 and the classifier 412 shown in FIG. 4) to ensure that the current (I) is large enough to induce a current (e.g., body current 114 shown in FIG. 1) that can pass through the body model 150A and be detected at the device button/touchscreen 130A while staying below the NEC's 1 mA threshold. Cognitively and dynamically managing the output power of the current (I) ensures that the user 150A, 150 cannot easily defeat the system 100A (or the system 100) with something as simple as wearing gloves or thick clothing. If the user 150A, 150 contacts the device button/touchscreen 130A (i.e., closes the switch 220) while the user 150A, 150 is also in contact with the user touch point 112A electric field (i.e., closes the switch 210), a closed circuit is established as shown in FIG. 2, and the user model 150A will act as a transmission medium for the current (e.g., body current 114) generated at the user touch point electric field 112A. In embodiments of the invention, capacitance from the user touch point electric field 112A could also be detected without a user model 150A bridging the gap between the user touch point electric field 112A and the device button/touchscreen 130A by, for example, configuring the computing device 140 (shown in FIG. 1) to detect capacitance when the computing device 140 is set down on an operatively coupled structure such as a table.

Figure 3:
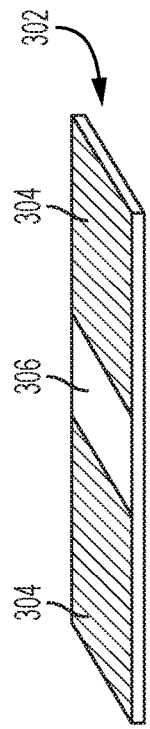
FIG. 3 is a block diagram illustrating an electrode/dielectric/electrode element that can be utilized in a touch-activated sensor embodying aspects of the invention.

FIG. 3 is a block diagram illustrating an electrode/dielectric/electrode sensing element 302, and FIG. 4 is a block diagram illustrating the electrode/dielectric/electrode sensing element 302 utilized in a smart touch-activated sensor 110A embodying aspects of the invention. In embodiments of the invention, the smart touch-activated sensor 110A is a more detailed example of the touch-activated sensor 110 (shown in FIG. 1). In embodiments of the invention, the smart touch-activated sensor 110A (and specifically, the electrodes 304) can be made from flexible material to facilitate incorporating the sensor 110A in a variety of touch point structures 120 (shown in FIG. 1). As best shown in FIG. 4, and with reference to certain features shown in FIG. 1, the local computing device 410 is configured to control the measurement & control circuitry 420 to generate an AC voltage (V1) at a known frequency (f1) and apply the AC voltage (V1) to the electrodes 304 to induce the electric fields (or electric field lines) 112. In embodiments of the invention, frequency (f1) is selected to be within the range from about 2 MHz to about 30 MHz because it has been demonstrated that a steady frequency response for intra-body communication is best achieved in the 2 MHz-30 MHz range. In embodiments of the invention, the electrodes 304 can optionally be enabled or disabled via another sensor to cut down on energy costs (e.g., pressure sensor, touch sensor, proximity sensor, etc.).

In accordance with aspects of the invention, when the user 150 (shown in FIG. 1) is close enough to the smart touch-activated sensor 110A to reduce or otherwise alter the electric fields 112 at a sufficient level, capacitive coupling will transfer energy to the user 150 by means of displacement currents (e.g., body currents 114 shown in FIG. 1) induced by the electric fields 112. The displacement current transferred to the user 150 will be out of phase (i.e., leading the voltage (V1) generated by the measurement & control circuitry 420) due to capacitance between the electrodes 304 but will be at the same known frequency (f1).

In accordance with aspects of the invention, the local computing device 410 and the classifier 412 are configured and arranged to apply machine learning techniques to training data that includes a variety of measurements and other data inputs. Examples of the such training data include a variety of measurements and other data related to the body current 114 (shown in FIG. 1), including but not limited to the body capacitance represented by the capacitive and resistive elements of the user model 150A (shown in FIG. 2), temperature at the smart touch-activated sensor 110A, humidity at the smart touch-activated sensor 110A, measured capacitance between the electrodes 304, and other data that is known to impact the travel path of the body current 114. In aspects of the invention, the classifier (or classifier algorithm) 412 is configured to extract features from the training data in order to "classify" the training data and uncover relationships between and among the classified training data. The classifier 412 uses the classified training data and the uncovered relationships between the classified training data to create a model of the path (or structures) through which the body current 114 will have to travel in order to reach and be detected by the touch-activated sensor 130. This model, referred to herein as a body current path (BCP) model, includes a variety of estimated characteristics of the body current path, including, for example, the likelihood that the user 150 is contacting the smart touch-activated sensor 110A through an article of clothing such as gloves or a sweater.

In accordance with aspects of the invention, the BCP model is used by the classifier 412 to dynamically determine and manage characteristics of the voltage (V1) that the measurement and control circuitry 420 applies to the electrodes 304 to generate the electrode current (I) and thereby induce the body current 114. In accordance with aspects of the invention, the classifier 412 uses the BCP model to dynamically select the voltage (V1) such that the voltage (V1) generates the electrode current (I) at a sufficient power level that the induced body current 114 can travel through the user 150 and be detected by the touch-activated sensor 130 while staying below the NEC's 1 mA threshold. In accordance with aspects of the invention, the BCP model can ensure that the frequency (f1) of the electrode current (I) is greater than the cutoff frequency of the capacitance between the electrodes 304 to not distort the electrode current (I) when it is capacitively coupled to the user 150. In embodiments of the invention, the BCP model can be limited to ensure that staying below the NEC's 1 mA threshold is the dominant constraint so that if the voltage (V1) required to travel through the user 150 and be detected by the touch-activated sensor 130 would exceed the NEC's 1 mA limit, no voltage (V1) is generated. Examples of suitable implementations of the classifier 412 include but are not limited to neural networks, support vector machines (SVMs), logistic regression, decision trees, hidden Markov Models (HMMs), etc. The learning or training performed by the classifier 412 can be supervised, unsupervised, or a hybrid that includes aspects of supervised and unsupervised learning. Supervised learning is when training data is already available and classified/labeled. Unsupervised learning is when training data is not classified/labeled so must be developed through iterations of the classifier. Unsupervised learning can utilize additional learning/training methods including, for example, clustering, anomaly detection, neural networks, deep learning, and the like. In accordance with aspects of the invention, data about the body current 114 detected at the touch-activated sensor 130 is fed back to the smart touch-activated sensor 110A and used as additional training data for creating the BCP model. In some embodiments of the invention, training data from a variety of instances of the system 100 and the smart touch-activated sensor 110A can be accumulated and stored (e.g., at a remote server) and provided through a wired or wireless connection as additional training data for creating the BCP model.

In aspects of the invention, the classifier 412 can be configured to apply confidence levels (CLs) to determinations made by the classifier 412 as to the characteristics of the voltage (V1) that measurement and control circuitry 420 will apply to the electrodes 304. When the classifier 412 determines that a CL in the determined characteristic(s) of voltage (V1) is below a predetermined threshold (TH) (i.e., CL<TH), the voltage (V1) characteristic can be classified as sufficiently low to justify a classification of "no confidence" in the determination. If CL>TH, the voltage (V1) characteristic can be classified as sufficiently high to justify utilizing the voltage (V1) characteristic. Many different predetermined TH levels can be provided. The voltage (V1) characteristics with CL>TH can be ranked from the highest CL>TH to the lowest CL>TH.

In embodiments of the invention, a network of the smart touch-activated sensors 110A can be positioned at the touch-point structure 120 such that it is possible for the user 150 to contact more than one instance of the smart touch-activated sensors 110A at the same time. Accordingly, in some embodiments of the invention, the smart touch-activated sensor 110A can be further configure to communicate (through a wired or wireless path) with other smart-touch-activated sensors to detect a situation where two instances of the smart touch-activated sensor 110A are attempting to transmit a body current 114 through the user 150, and to adjust the body current 114 generated by each instance of the smart touch-activated sensor 110A such that the total body current 114 through the user 150 is maintained below the 1 mA limit.

FIG. 5 depicts an example of how the touch-activated sensor 130 and computing device 140 shown in FIG. 1 can be implemented as a smart touch-activated sensor 130B that is an integral component (e.g., a touchscreen or a multi-touch element) of a computing device (or application processor) 140A. The smart touch-activated sensor 130B includes processing circuitry 502 configured and arranged to detect capacitive changes at the sensor 130B when the user 150 reduces or otherwise alters the electric fields 132 at a sufficient level to induce a detectable capacitive change at the sensor 130B. In accordance with aspects of the invention, when the user 150 contacts the touch-activated sensor 130B of the computing device 140A, a capacitive coupling path is created between the user 150 and the touch-activated sensor 130B of the computing device 140A, and the body current 114 that was induced in the user 150 at the known frequency (f1) by the touch-activated sensor 110, 110A (shown in FIGS. 1 and 4) is capacitively coupled from the user 150 to the touch-activated sensor 130B of the computing device 140A at the same known frequency (f1). In accordance with aspects of the invention, the processing circuitry 502 and/or the computing device 140B are configured and arranged to analyze any current received at the touch-activated sensor 130B of the computing device 140A in order to determine whether the current received at the touch-activated sensor 130B is at or within a predetermined range of the known frequency (f1), which means that the current received at the touch-activated sensor 130B is the body current 114. In accordance with aspects of the invention, the computing device 140A (or the processing circuitry 502) is configured and arranged to place the computing device 140A in a limited access mode based at least in part on determining that a current received at the touch-activated sensor 130B is the body current 114. The limited access mode can be configured to limit functionality of the computing device 140A in a variety of ways while always allowing emergency calling and other emergency features. In embodiments of the invention, the limited access mode can be tailored to the situation with the use of different frequencies for the known frequency generated at the remote touch-activated sensor 110, 110A (shown in FIGS. 1 and 4). For example, the computing device 140A (or the processing circuitry 502) detecting the body current 114 can place the computing device 140A in airplane mode, or the computing device 140A (or the processing circuitry 502) detecting a second known frequency can place the computing device 140A in a limited access mode that allows texts but no calls.

In accordance with aspects of the invention, the computing device 140A (or the processing circuitry 502) can be configured and arranged to analyze current received at the touch-activated sensor 130B of the computing device 140A using a set of computer program instructions. In embodiments of the invention, the set of computer program instructions can be downloaded to the computing device 140A (or the processing circuitry 502) over the network 160 to which the computing device 140A (or the processing circuitry 502) is communicatively coupled. In embodiments of the invention, the computer program instructions are configured to analyze at least one measured characteristic of the body current 114 by sampling the body current 114, comparing a frequency of the body current 114 to a predetermined frequency, and initiating limiting the functionality of the computing device 140A based at least in part on determining that the frequency of the body current 114 is within a range of the predetermined frequency. In embodiments of the invention, the network 160 can be configured and arranged to require downloading the computer program instructions as a condition for allowing the computing device 140A to access to the network 160. In embodiments of the invention, the network 160 can include network blocking systems configured and arranged such that the only connectivity point for the computing device 140A in a particular environment (e.g., a restaurant, a movie theater, and the like) is through the network 160, and the network 160 requires downloading the computer program instructions as a condition for allowing the computing device 140A to access to the selected network 160.

Figure 6:
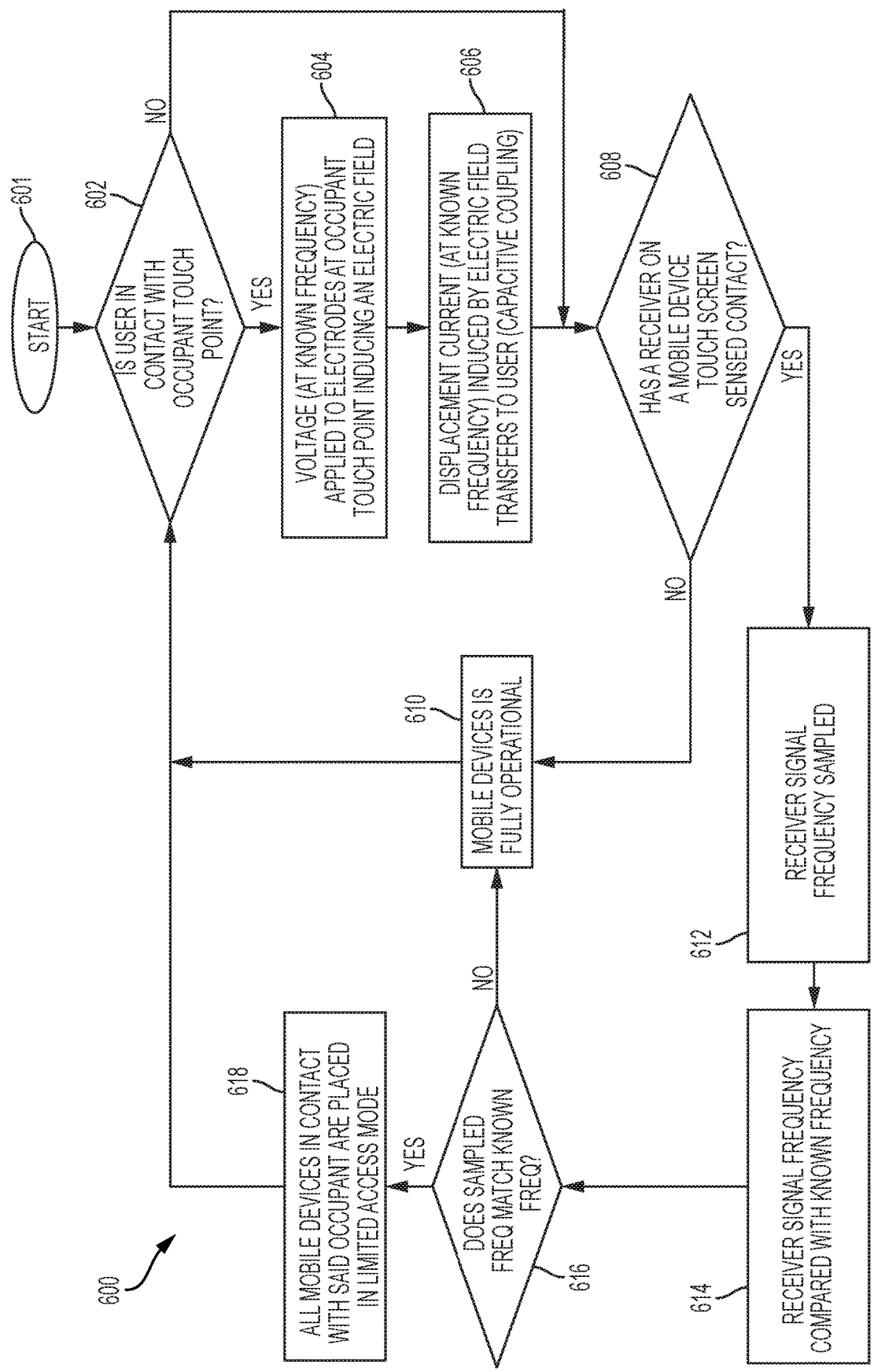
FIG. 6 is a flow diagram illustrating a methodology embodying aspects of the invention.

FIG. 6 is a flow diagram illustrating a methodology 600 embodying aspects of the invention. The methodology 600 can be implemented by the system 100 shown in FIG. 1, wherein the touch-activated sensor 130 is implemented as the touch activated sensor 130B shown in FIG. 5, and wherein the touch-activated sensor 110 is implemented as the smart touch-activated sensor 110A shown in FIG. 4. As shown in FIG. 6, methodology 600 starts at block 601 and moves to decision block 602 where the sensor 110A determines whether the user 150 is in contact with occupant touch points defined by the locations of the sensor 110A. If the answer to the inquiry at decision block 602 is no, the methodology 600 moves to decision block 608. If the answer to the inquiry at decision block 602 is yes, the methodology 600 moves to block 604 where the computing device 410, classifier 412, and measurement and control circuitry 420 apply a voltage (V1) at a known frequency (f1) to the electrodes 304 to generate the electric fields 112. At block 606, when the user 150 is sufficiently close to the sensor 110A to reduce or otherwise alter the electric fields 112, the body current 114 (i.e., displacement current at the known frequency (f1)) is induced by electric field transfer to the user 150 using capacitive coupling.

The methodology 600 moves to decision block 608 where the sensor 130B determines whether the user 150 has contacted the sensor 130B (i.e., the touchscreen of a mobile device). If the answer to the inquiry at decision block 608 is no, the methodology 600 moves to block 610 where the functionality of the computing device 140, 140A remains fully operational. If the answer to the inquiry at decision block 608 is yes, the methodology 600 moves to block 612 where the computing device 140A (or the processing circuitry 502) samples the currents received at the sensor 130B. At block 614, the computing device 140A (or the processing circuitry 502) compares the frequency of the currents received at the sensor 130B with the known frequency (f1). The methodology 600 moves to decision block 616 and determines whether the sampled frequency matches the known frequency (f1). In embodiments of the invention, the sampled frequency can match the known frequency (f1) if the sampled frequency is within a predetermined range of the known frequency (f1). If the answer to the inquiry at decision block 616 is no, the methodology 600 moves to decision block 610 where the functionality of the computing device 140, 140A remains fully operational. If the answer to the inquiry at decision block 616 is yes, the methodology 600 moves to block 618 where the functionality of the computing device 140, 140A is placed in a limited access mode.

FIG. 7 depicts an example of how the touch-activated sensor 130 and computing device 140 shown in FIG. 1 can be implemented as a smart touch-activated sensor 130C that is an integral component (e.g., a touchscreen or a multi-touch element) of a computing device (or application processor) 140B. The smart touch-activated sensor 130C includes printed circuit board (PCB) 702 that includes processing circuitry configured and arranged to detect capacitive changes (represented by the capacitor 740) at the sensor 130C when the user 150 reduces or otherwise alters the electric fields 132 (shown in FIGS. 1 and 5) at a sufficient level to induce a detectable capacitive change at the sensor 130C. In accordance with aspects of the invention, when the user 150 contacts the touch-activated sensor 130C of the computing device 140B, a capacitive coupling path (represented by capacitor 740) is created between the user 150 and the touch-activated sensor 130C of the computing device 140B, and the body current 114 that was induced in the user 150 at the known frequency (f1) by the touch-activated sensor 110, 110A (shown in FIGS. 1 and 4) is capacitively coupled from the user 150 to the touch-activated sensor 130C of the computing device 140B at the same known frequency (f1). In accordance with aspects of the invention, the PCB 702 and analog-to-digital conversion (ADC) circuitry 710 are configured and arranged to detect the capacitance (or capacitive coupling) 740 and initiate an operation of the computing device 140C in response thereto. In accordance with aspects of the invention, the computing device 140C is configured and arranged to include circuitry 720 that analyzes any current received at the touch-activated sensor 130C of the computing device 140B in order to determine whether the current received at the touch-activated sensor 130C is at or within a predetermined range of the known frequency (f1), which means that the current received at the touch-activated sensor 130C is the body current 114. In accordance with aspects of the invention, the computing device 140C is configured and arranged to place the computing device 140C in a limited access mode based at least in part on determining that a current received at the touch-activated sensor 130C is the body current 114. The limited access mode can be configured to limit functionality of the computing device 140B in a variety of ways while always allowing emergency calling and other emergency features. In embodiments of the invention, limited access mode can be tailored to the situation with the use of different frequencies for the known frequency generated at the remote touch-activated sensor 110, 110A (shown in FIGS. 1 and 4). For example, the computing device 140B detecting the body current 114 can place the computing device 140B in airplane mode, or the computing device 140B detecting a second known frequency can place the computing device 140B in a limited access mode that allows texts but no calls.

In accordance with aspects of the invention, circuitry 720 that is configured and arranged to analyze current received at the touch-activated sensor 130C of the computing device 140B includes a frequency mixer 722, a low-pass filer 726, a sample and compare circuit 728, and limited access mode circuitry 730. In embodiments of the invention, current received at the sensor 130C is capacitively coupled from the user 150 to the sensor 130C and is sent through the frequency mixer 722 along with a reference signal 724. In embodiments of the invention, the reference signal 724 is a known frequency that is close to, but not equal to, the frequency (f1) of the body current 114. In embodiments of the invention, the reference signal 724 is generated on the computing device 140B and could be an oscillator signal already used on the PCB 702. Although there will be a slight drop in the power of the body current 114 due to human body resistance (e.g., body model 150A shown in FIG. 2) and a slight phase shift as compared to the original body current 114 generated at the sensor 110A (shown in FIG. 4) due to human body capacitance (e.g., body model 150A shown in FIG. 2), the frequency (f1) of the body current 114 will remain the same.

The output of the frequency mixer 722 will have two components, namely, the sum of the two input frequencies, and the difference between the two input frequencies. The output of the frequency mixer 726 is sent through the low pass filter 726. The frequency band of the low pass filter 726 is selected such that the filter 726 will only yield the difference output of the mixer 722. The sample and compare circuit 728 uses known circuit components to sample the low frequency output from the filter 726 to determine if its amplitude exceeds a threshold. If the amplitude of the low frequency output from the filter 726 exceeds the threshold, the limited access mode circuitry 730 is initiated.

Figure 8:
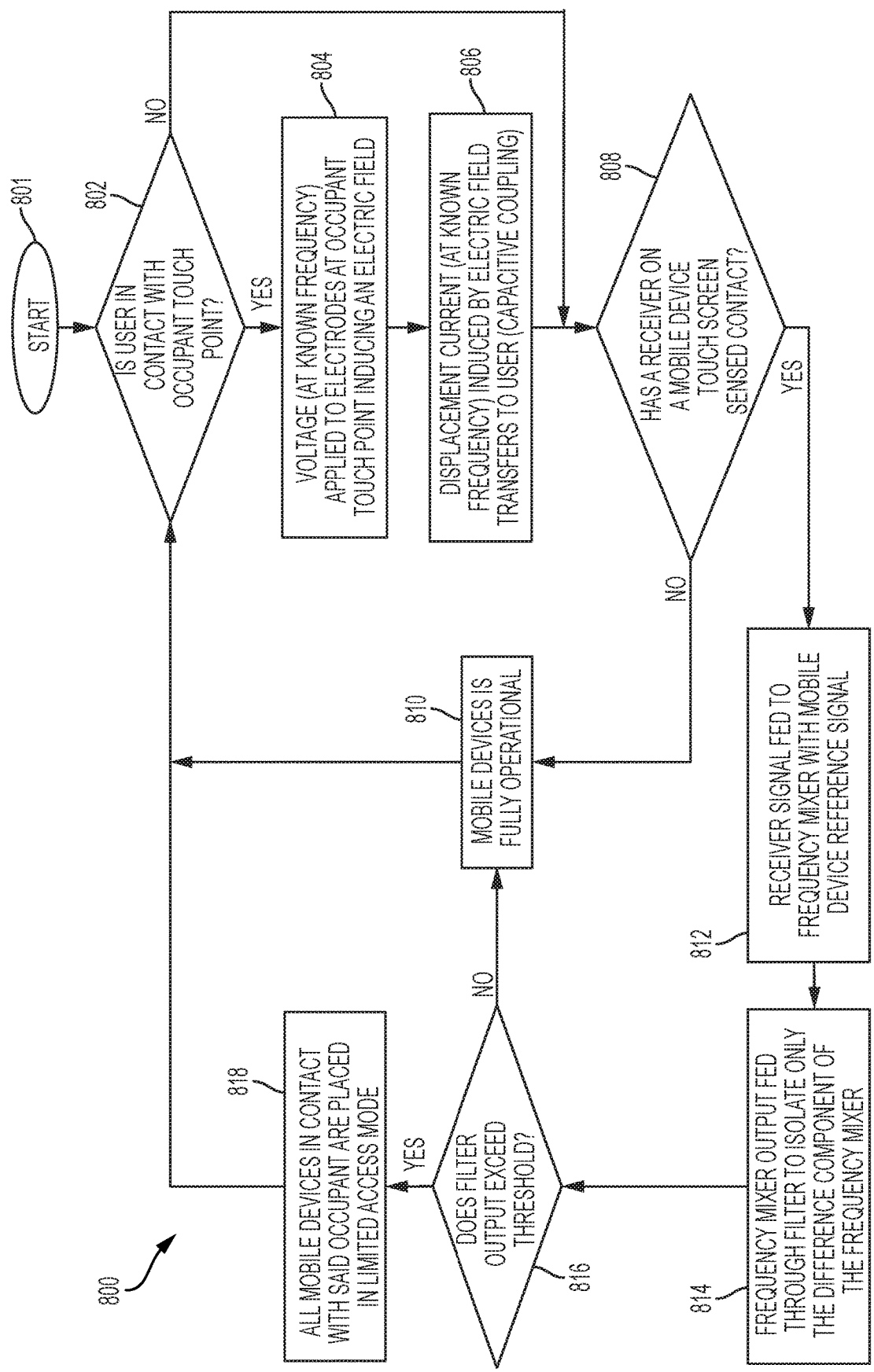
FIG. 8 is a flow diagram illustrating a methodology embodying aspects of the invention.

FIG. 8 is a flow diagram illustrating a methodology 800 embodying aspects of the invention. The methodology 800 can be implemented by the system 100 shown in FIG. 1, wherein the touch-activated sensor 130 is implemented as the touch activated sensor 130C shown in FIG. 7, the computing device 140 is implemented as the computing device 140B shown in FIG. 7, and the touch-activated sensor 110 is implemented as the smart touch-activated sensor 110A shown in FIG. 4. As shown in FIG. 8, methodology 800 starts at block 801 and moves to decision block 802 where the sensor 110A determines whether the user 150 is in contact with occupant touch points defined by the locations of the sensor 110A. If the answer to the inquiry at decision block 802 is no, the methodology 800 moves to decision block 808. If the answer to the inquiry at decision block 802 is yes, the methodology 800 moves to block 804 where the computing device 410, classifier 412, and measurement and control circuitry 420 apply a voltage (V1) at a known frequency (f1) to the electrodes 304 to generate the electric fields 112. At block 806, when the user 150 is sufficiently close to the sensor 110A to reduce or otherwise alter the electric fields 112, the body current 114 (i.e., displacement current at the known frequency (f1)) is induced by electric field transfer to the user 150 using capacitive coupling.

The methodology 800 moves to decision block 808 where the sensor 130C determines whether the user 150 has contacted the sensor 130C (i.e., the touchscreen of a mobile device). If the answer to the inquiry at decision block 808 is no, the methodology 800 moves to block 810 where the functionality of the computing device 140, 140B remains fully operational. If the answer to the inquiry at decision block 808 is yes, the methodology 800 moves to block 812 where current received at the sensor 130C and the reference signal 724 are provided to the frequency mixer 722, where the output of the frequency mixer 722 will have two components, namely, the sum of the two input frequencies, and the difference between the two input frequencies. At block 814, the output of the frequency mixer 722 is fed to a low-pass filter 726 to isolate only the difference component of the output of the frequency mixer 722. The methodology 800 moves to decision block 816 where a sample and compare circuit 728 is used to determine whether an amplitude of the output of the filter 722 exceeds a threshold. If the answer to the inquiry at decision block 816 is no, the methodology 800 moves to decision block 810 where the functionality of the computing device 140, 140B remains fully operational. If the answer to the inquiry at decision block 816 is yes, the methodology 800 moves to block 818 where the functionality of the computing device 140, 140B is placed in a limited access mode.

Figure 9:
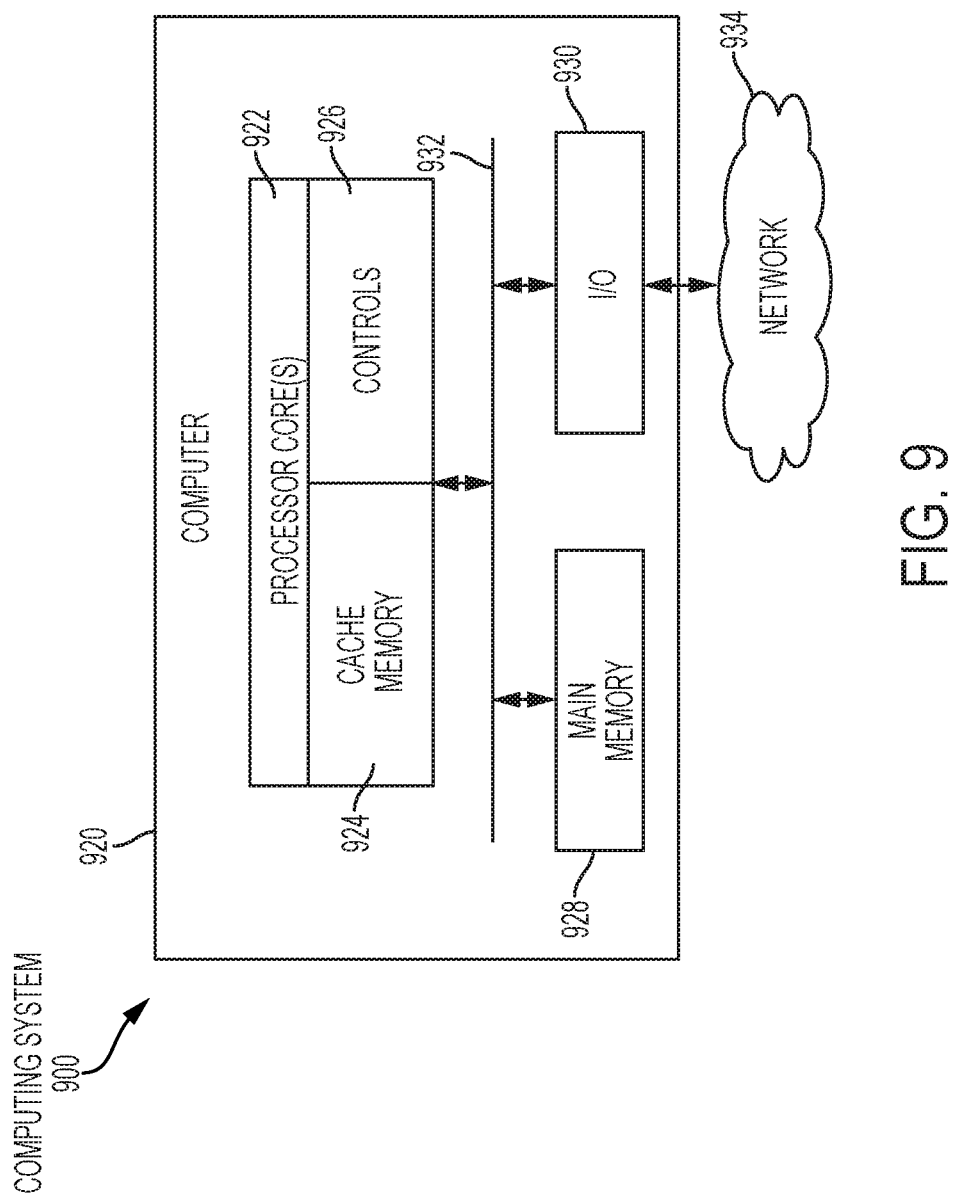
FIG. 9 is a computer system capable of implementing aspects of the invention.

FIG. 9 illustrates an example of a computer system 900 that can be used to implement any of the computer-based components of the various embodiments of the invention described herein. The computer system 900 includes an exemplary computing device ("computer") 902 configured for performing various aspects of the content-based semantic monitoring operations described herein in accordance aspects of the invention. In addition to computer 902, exemplary computer system 900 includes network 914, which connects computer 902 to additional systems (not depicted) and can include one or more wide area networks (WANs) and/or local area networks (LANs) such as the Internet, intranet(s), and/or wireless communication network(s). Computer 902 and additional system are in communication via network 914, e.g., to communicate data between them.

Exemplary computer 902 includes processor cores 904, main memory ("memory") 910, and input/output component(s) 912, which are in communication via bus 903. Processor cores 904 includes cache memory ("cache") 906 and controls 908, which include branch prediction structures and associated search, hit, detect and update logic, which will be described in more detail below. Cache 906 can include multiple cache levels (not depicted) that are on or off-chip from processor 904. Memory 910 can include various data stored therein, e.g., instructions, software, routines, etc., which, e.g., can be transferred to/from cache 906 by controls 908 for execution by processor 904. Input/output component(s) 912 can include one or more components that facilitate local and/or remote input/output operations to/from computer 902, such as a display, keyboard, modem, network adapter, etc. (not depicted).

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented-method of operating a computing device, the computer-implemented method comprising:
receiving, using a local touch-activated sensor of the computing device, an input signal;
wherein the input signal has been:
generated at a remote touch-activated sensor based on capacitive coupling between the remote touch-activated sensor and a human;
passed to the human using the capacitive coupling between the local touch-activated sensor and the human;
passed through the human; and
transmitted from the human to the local touch-activated sensor of the computing device using a capacitive coupling between the human and the local touch-activated sensor; and
limiting functionality of the computing device based at least in part on analyzing, using the computing device, at least one characteristic of the input signal;
wherein analyzing, using the computing device, the at least one measured characteristic of the input signal comprises:
using a mixer circuit to generate:
a difference signal comprising a difference between the input signal and a reference signal; and
a sum signal comprising a sum of the input signal and the reference signal;
using a low pass filter to allow the difference signal to pass based on determining that a frequency of the difference signal is within a frequency range of the low pass filter;
using a sample and comparison circuit to sample the difference signal output by the low pass filter and compare an amplitude of the difference signal output by the low pass filter to a threshold; and
initiating limiting the functionality of the computing device based at least in part on determining that the amplitude of the difference signal output by the low pass filter exceeds the threshold.

2. The computer-implemented method of claim 1, wherein:
in addition to transmitting the input signal, the capacitive coupling between the human and the local touch-activated sensor also generates an operational signal associated with a function of the computing device; and the operational signal is configured to, when the function associated with operational signal has not been limited based on analyzing the input signal, initiate the function.

3. The computer-implemented method of claim 1, wherein the remote touch-activated sensor generates the input signal.

4. The computer-implemented method of claim 3, wherein the at least one characteristic of the input signal comprises a selected frequency.

5. The computer-implemented method of claim 1, wherein analyzing, using the computing device, the at least one measured characteristic of the input signal comprises using computer program instructions configured to control a processor of the computing device to:
sample the input signal;
compare a frequency of the input signal to a predetermined frequency; and
initiate limiting the functionality of the computing device based at least in part on determining that the frequency of the input signal is within a range of the predetermined frequency.

6. The computer-implemented method of claim 5 further comprising using an antenna of the computing device to download the computer program instructions from a network.

7. A computing device comprising:
a memory;
a processor communicatively coupled to the memory; and
a local touch-activated sensor communicatively coupled to the memory and the processor;
wherein the computing device is configured to perform operations comprising:
receiving, using the local touch-activated sensor, an input signal;
wherein the input signal has been:
generated at a remote touch-activated sensor based on capacitive coupling between the remote touch-activated sensor and a human;
passed to the human using the capacitive coupling between the remote touch-activated sensor and the human;
passed through the human; and
transmitted from the human to the local touch-activated sensor using a capacitive coupling between the human and the local touch-activated sensor; and
limiting functionality of the computing device based at least in part on analyzing at least one characteristic of the input signal;
wherein analyzing the at least one measured characteristic of the input signal comprises:
using a mixer circuit to generate:
a difference signal comprising a difference between the input signal and a reference signal; and
a sum signal comprising a sum of the input signal and the reference signal;
using a low pass filter to allow the difference signal to pass based on determining that a frequency of the difference signal is within a frequency range of the low pass filter;
using a sample and comparison circuit to sample the difference signal output by the low pass filter and compare an amplitude of the difference signal output by the low pass filter to a threshold; and
initiating limiting the functionality of the computing device based at least in part on determining that the amplitude of the difference signal output by the low pass filter exceeds the threshold.

8. The device of claim 7, wherein:
in addition to transmitting the input signal, the capacitive coupling between the human and the local touch-activated sensor also generates an operational signal associated with a function of the computing device; and
the operational signal is configured to, when the function associated with operational signal has not been limited based on analyzing the input signal, initiate the function.

9. The device of claim 7, wherein the remote touch-activated sensor generates the input signal.

10. The device of claim 9, wherein the at least one characteristic of the input signal comprises a selected frequency.

11. The device of claim 7, wherein analyzing the at least one measured characteristic of the input signal comprises using computer program instructions configured to control the processor of the computing device to:
sample the input signal;
compare a frequency of the input signal to a predetermined frequency; and
initiate limiting the functionality of the computing device based at least in part on determining that the frequency of the input signal is within a range of the predetermined frequency.

12. The device of claim 11 further comprising using an antenna of the computing device to download the computer program instructions from a network.

13. A computer program product for operating a computing device, the computer program product comprising a computer readable program stored on a computer readable storage medium, wherein the computer readable program, when executed on the computing device, causes a processor system of the computing device to perform operations comprising:
receiving, using a local touch-activated sensor of the computing device, an input signal;
wherein the input signal has been:
generated at a remote touch-activated sensor based on capacitive coupling between the remote touch-activated sensor and a human;
passed to the human using the capacitive coupling between the remote touch-activated sensor and the human;
passed through the human; and
transmitted from the human to the local touch-activated sensor of the computing device using a capacitive coupling between the human and the local touch-activated sensor; and limiting functionality of the computing device based at least in part on analyzing, using the computing device, at least one characteristic of the input signal;
wherein analyzing the at least one measured characteristic of the input signal comprises:
using a mixer circuit to generate:
a difference signal comprising a difference between the input signal and a reference signal; and
a sum signal comprising a sum of the input signal and the reference signal;
using a low pass filter to allow the difference signal to pass based on determining that a frequency of the difference signal is within a frequency range of the low pass filter;
using a sample and comparison circuit to sample the difference signal output by the low pass filter and compare an amplitude of the difference signal output by the low pass filter to a threshold; and
initiating limiting the functionality of the computing device based at least in part on determining that the amplitude of the difference signal output by the low pass filter exceeds the threshold.

14. The computer program product of claim 13, wherein:
in addition to transmitting the input signal, the capacitive coupling between the human and the local touch-activated sensor also generates an operational signal associated with a function of the computing device; and
the operational signal is configured to, when the function associated with operational signal has not been limited based on analyzing the input signal, initiate the function.

15. The computer program product of claim 13, wherein:
the remote touch-activated sensor generates the input signal; and
the at least one characteristic of the input signal comprises a selected frequency.

16. The computer program product of claim 13, wherein analyzing the at least one measured characteristic of the input signal comprises using downloaded computer program instructions configured to control the processor system to:
sample the input signal;
compare a frequency of the input signal to a predetermined frequency; and
initiate limiting the functionality of the computing device based at least in part on determining that the frequency of the input signal is within a range of the predetermined frequency.

17. The computer program product of claim 16 further comprising using an antenna of the computing device to download the downloaded computer program instructions from a network to which the computing device is communicatively coupled.

* * * * *